United States Patent
Van Zyl et al.

(10) Patent No.: US 11,264,209 B2
(45) Date of Patent: *Mar. 1, 2022

(54) APPLICATION OF MODULATING SUPPLIES IN A PLASMA PROCESSING SYSTEM

(71) Applicant: Advanced Energy Industries, Inc., Fort Collins, CO (US)

(72) Inventors: Gideon Van Zyl, Fort Collins, CO (US); Kevin Fairbairn, Los Gatos, CA (US); Denis Shaw, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/031,027

(22) Filed: Sep. 24, 2020

(65) Prior Publication Data
US 2021/0074513 A1    Mar. 11, 2021

Related U.S. Application Data

(63) Continuation of application No. 16/194,125, filed on Nov. 16, 2018, now Pat. No. 10,811,227.
(Continued)

(51) Int. Cl.
*H01J 37/32* (2006.01)
(52) U.S. Cl.
CPC .. *H01J 37/32146* (2013.01); *H01J 37/32183* (2013.01); *H01J 37/32357* (2013.01);
(Continued)
(58) Field of Classification Search
None
See application file for complete search history.

(56) References Cited

U.S. PATENT DOCUMENTS

| | | |
|---|---|---|
| 4,891,118 A | 1/1990 | Ooiwa et al. |
| 6,129,806 A | 10/2000 | Kaji et al. |

(Continued)

FOREIGN PATENT DOCUMENTS

WO    2014035889 A1    3/2014

OTHER PUBLICATIONS

Taiwan Patent Office, "Office Action Regarding Application No. 107140924", dated Jan. 15, 2021, p. 12, Published in: TW.

(Continued)

*Primary Examiner* — Crystal L Hammond
(74) *Attorney, Agent, or Firm* — Neugeboren O'Dowd PC

(57) ABSTRACT

Plasma processing systems and methods are disclosed. The system may include at least one modulating supply that modulates plasma properties where the modulation of the plasma properties has a repetition period, T. A synchronization module configured to send a synchronization signal with a synchronization-signal-repetition-period that is an integer multiple of T to at least one piece of equipment connected to the plasma processing system. A waveform-communication module communicates characteristics of a characterized waveform to at least one piece of equipment connected to the plasma system to enable synchronization of pieces of equipment connected to the plasma processing system. The characterized waveform may contain information about the modulation of the plasma or information about a desired waveform of a piece of equipment connected to the plasma processing system.

19 Claims, 14 Drawing Sheets

Related U.S. Application Data

(60) Provisional application No. 62/588,255, filed on Nov. 17, 2017.

(52) U.S. Cl.
CPC ... *H01J 37/32697* (2013.01); *H01J 2237/332* (2013.01); *H01J 2237/334* (2013.01)

(56) References Cited

U.S. PATENT DOCUMENTS

| | | | |
|---|---|---|---|
| 6,162,709 | A | 12/2000 | Raoux et al. |
| 6,885,453 | B2 | 4/2005 | Kaufmann |
| 9,283,635 | B2 | 3/2016 | Peters |
| 9,305,803 | B2 | 4/2016 | Morimoto et al. |
| 9,604,877 | B2 | 3/2017 | Veerasamy et al. |
| 9,761,419 | B2 | 9/2017 | Nagami |
| 10,607,813 | B2 | 3/2020 | Fairbairn et al. |
| 2002/0115301 | A1 | 8/2002 | Savas |
| 2004/0007326 | A1 | 1/2004 | Roche et al. |
| 2005/0260354 | A1 | 11/2005 | Singh et al. |
| 2009/0200494 | A1 | 8/2009 | Hatem et al. |
| 2009/0298287 | A1 | 12/2009 | Shannon et al. |
| 2010/0296977 | A1 | 11/2010 | Hancock |
| 2014/0062303 | A1 | 3/2014 | Hoffman et al. |
| 2014/0302682 | A1* | 10/2014 | Muto ............ H01J 37/32715 438/711 |
| 2014/0305905 | A1 | 10/2014 | Yamada et al. |
| 2015/0076112 | A1 | 3/2015 | Sriraman et al. |
| 2015/0315698 | A1* | 11/2015 | Chistyakov ....... H01J 37/32082 204/192.15 |
| 2016/0020108 | A1 | 1/2016 | Ranjan et al. |
| 2016/0056017 | A1 | 2/2016 | Kim et al. |
| 2016/0126068 | A1* | 5/2016 | Lee ............... H01J 37/32091 156/345.25 |
| 2016/0126069 | A1 | 5/2016 | Kwon et al. |
| 2016/0240353 | A1 | 8/2016 | Nagami |
| 2017/0099723 | A1 | 4/2017 | Nagami et al. |
| 2019/0066979 | A1 | 2/2019 | Shoeb et al. |
| 2021/0202209 | A1 | 7/2021 | Van Zyl et al. |

OTHER PUBLICATIONS

SIPO, "Office Action Regarding Chinese Patent Application No. 201710704712.5", dated Apr. 1, 2020, p. 7, Published in: CN.
CNIPA, "Decision of Rejection Regarding Application No. 201710704712.5", dated Aug. 10, 2020, p. 8, Published in: CN.
Brayton, John Joseph, "Office Action Regarding U.S. Appl. No. 15/667,239", dated Jun. 24, 2020, p. 131, Published in: US.
Brayton, John Joseph, "Office Action Regarding U.S. Appl. No. 15/495,513", dated Jul. 2, 2020, p. 87, Published in: US.
Yukari Nakamura, "International Preliminary Report on Patentability Regarding International Application No. PCT/US2018/061653", dated May 28, 2020, p. 9, Published in: CH.
Luque, Renan, "Office Action Regarding U.S. Appl. No. 16/803,020", dated Apr. 22, 2020, p. 36, Published in: US.
Athina Nickitas-Etienne, "International Preliminary Report on Patentability Regarding International Application No. PCT/US2018/061575", dated May 28, 2020, p. 9, Published in: CH.
Hammond, Crystal, "Office Action Regarding U.S. Appl. No. 16/246,996", dated Dec. 12, 2019, p. 84, Published in: US.
Hammond, Crystal, "Office Action Regarding U.S. Appl. No. 16/194,125", dated Dec. 12, 2019, p. 88, Published in: US.
Hammond, Crystal, "Office Action Regarding U.S. Appl. No. 16/270,391", dated Dec. 12, 2019, p. 78, Published in: US.
Fujimoto, Kayoko, "Notice for Reasons of Rejection Regarding Japanese Patent Application No. 2020-081092", dated Apr. 1, 2021, p. 6, Published in: JP.
Kudeka, Stephan, "Communication Pursuant to Article 94(3) EPC Regarding Application No. 10 770 205.2", dated Jun. 8, 2021, p. 6, Published in: EU.
Brayton, John Joseph, "Office Action Regarding U.S. Appl. No. 15/495,513", dated Apr. 14, 2021, p. 10, Published in: US.
Luque, Renan, "Office Action Regarding U.S. Appl. No. 16/896,709", dated May 25, 2021, p. 36, Published in: US.
TIPO, "Office Action Regarding Taiwanese Patent Application No. 10714924", dated Aug. 20, 2021, p. 7, Published in: TW.
EPO, "Extended European Search Report Regarding Patent Application No. 18877737.9", dated Aug. 25, 2021, pp. 165, Published in: EP.
EPO, "Extended Search Report Regarding European Patent Appliication No. 18877322", dated Sep. 14, 2021, pp. 129, Published in: EP.
EPO, "Extended European Search Report Regarding Patent Application No. 18878531.5", dated Sep. 1, 2021, pp. 126, Published in: EP.
Harry Kim, "International Search Report and Written Opinion Regarding International Application No. PCT/US2020/027927", dated Sep. 17, 2021, pp. 14, Published in: US.

* cited by examiner

APPLICATION OF MODULATING SUPPLIES IN A PLASMA PROCESSING SYSTEM

CLAIM OF PRIORITY UNDER 35 U.S.C. § 120

The present application for patent is a Continuation of patent application Ser. No. 16/194,125 entitled "APPLICATION OF MODULATING SUPPLIES IN A PLASMA PROCESSING SYSTEM" filed Nov. 16, 2018, which claims priority to Provisional Application No. 62/588,255 entitled "IMPROVED APPLICATION OF AN EV SOURCE IN PLASMA PROCESSING EQUIPMENT" filed Nov. 17, 2017, and assigned to the assignee hereof and hereby expressly incorporated by reference herein.

BACKGROUND

Field

The present disclosure relates generally to plasma processing. In particular, but not by way of limitation, the present disclosure relates to interoperation of equipment coupled to a plasma processing system.

Background

Plasma processing systems for etching and deposition have been utilized for decades, but advancements in processing techniques and equipment technologies continue to create increasingly more complex systems. At the same time, the decreasing dimensions of structures created with workpieces requires increasingly precise control and interoperation of plasma processing equipment. Current control methodologies and associated systems are not capable of addressing several issues that are associated with the complex systems of today and tomorrow; thus, there is a need for new and improved control over disparate, yet interdependent, plasma processing equipment.

SUMMARY

According to an aspect, a plasma processing system includes at least one modulating supply that modulates plasma properties where the modulation of the plasma properties has a repetition period, T. The plasma processing system includes a synchronization module configured to send a synchronization signal with a synchronization-signal-repetition-period, which is an integer multiple of T, to at least one piece of equipment connected to the plasma processing system. The plasma processing system also includes a waveform communication module configured to communicate characteristics of a characterized waveform with the repetition period T to least one piece of equipment connected to the plasma system to enable synchronization of pieces of equipment connected to the plasma processing system where the characterized waveform with the repetition period T contains at least one of information about the modulation of the plasma or information about a desired waveform of a piece of equipment connected to the plasma processing system.

Another aspect may be characterized as a control method for a plasma processing system. The method includes modulating plasma properties with a modulating supply where the modulation of the plasma properties has a repetition period, T. The method also includes characterizing a waveform with a repetition period, T, containing at least one of information about the modulation of the plasma or a desired waveform of a piece of equipment connected to the plasma processing system to produce a waveform dataset. The waveform dataset is sent to at least one piece of equipment connected to the plasma system, and the synchronization signal with a synchronization-signal-repetition-period that is an integer multiple of T to the at least one piece of equipment connected to the plasma system.

Yet another aspect may be characterized as a plasma processing control system that includes a waveform-characterization module configured to generate a waveform dataset for an output waveform of a piece of equipment connected to a plasma system. A waveform-repetition module is included to determine a repetition period, T, for a piece of equipment connected to the plasma system, and a waveform-communication module is configured to communicate the waveform data set to at least one of the piece of equipment or another piece of equipment connected to the plasma system. The plasma processing system also includes a waveform communication module and a synchronization module. The waveform communication module is configured to communicate the waveform dataset to at least one of the piece of equipment or another piece of equipment connected to the plasma system, and the synchronization module is configured to send a synchronization pulse with a synchronization pulse repetition period that is an integer multiple of T to a piece of equipment connected to the plasma system.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the following disclosure generally refers to wafer plasma processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to effect a surface change, subsurface change, deposition or removal by physical or chemical means.

This disclosure may utilize plasma processing and substrate biasing techniques as disclosed in U.S. Pat. Nos. 9,287,092, 9,287,086, 9,435,029, 9,309,594, 9,767,988, 9,362,089, 9,105,447, 9,685,297, 9,210,790. The entirety of these applications is incorporated herein by reference. But it should be recognized that the reference in this specification to any prior publication (or information derived from it), or to any matter which is known, is not an acknowledgment or admission or any form of suggestion that the prior publication (or information derived from it) or known matter is conventional, routine, or forms part of the common general knowledge in the field of endeavor to which this specification relates.

For the purposes of this disclosure, source generators are those whose energy is primarily directed to generating and sustaining the plasma, while "bias supplies" are those whose energy is primarily directed to generating a surface potential for attracting ions and electrons from the plasma.

Figure 1:
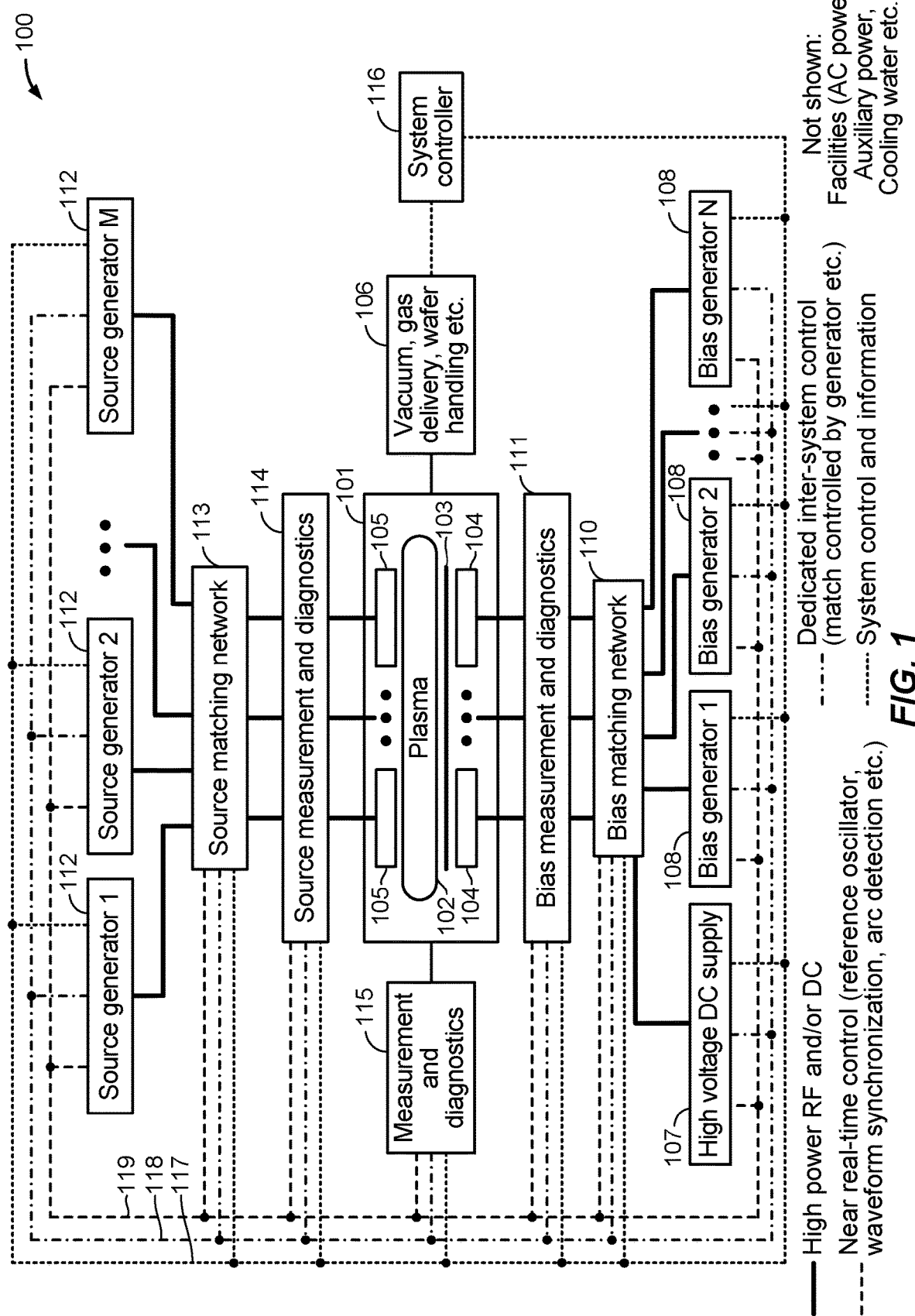
FIG. 1 depicts an embodiment of a plasma processing system designed to achieve control over plasma properties.

FIG. 1 shows an embodiment of a plasma processing system with many pieces of equipment coupled directly and indirectly to plasma chamber 101, which contains a plasma 102. The equipment includes vacuum handling and gas delivery equipment 106, bias generators 108, a bias matching network 110, bias measurement and diagnostics 111, source generators 112, a source matching network 113, source measurement and diagnostics 114, measurement and diagnostics 115, and a system controller 116. The embodiment in FIG. 1, and other embodiments described herein, are exemplary of the complexity of plasma processing systems, and the depiction of plasma systems herein helps to convey the interrelations of the equipment coupled to the plasma chamber 101.

An example of the interrelations of the plasma processing equipment is the effect that modulating supplies (e.g., source generators 112, bias generators 108, and other modulating supplies discussed further herein) have on plasma properties (and control of the same). More specifically, modulating supplies can cause strong modulation of plasma properties such as the impedance presented by the plasma 102 to equipment of the plasma processing system 100. Plasma modulation can also cause aliasing of measurements of plasma properties. Additional details about the effects of modulation of plasma properties are discussed further herein.

Shown in FIG. 1 is a plasma processing system 100 (e.g., deposition or etch system) containing a plasma chamber 101 within which a workpiece (e.g., a wafer) 103 is contained. A number of bias electrodes 104 are connected through the bias measurement and diagnostic system 111 to the bias match network 110 to which a number of bias generators 108 are connected. The bias electrodes 104 may be built into an electrostatic chuck to hold the workpiece 103 in place. This may involve integration of a high voltage DC power supply 107 into the system. In many applications, a single bias electrode 104 is used, but utilization of many bias electrodes 104 may be used to achieve a desired spatial control.

The bias generators 108 depicted in FIG. 1 may be lower frequency (e.g., 400 kHz to 13.56 MHz) RF generators that apply a sinusoidal waveform. Also shown is a set of source electrodes 105 connected to a number of source generators 112 through the source measurement and diagnostics system 114 and source matching network 113. In many applications, power from a single source generator 112 is connected to one or multiple source electrodes 105. The source generators 112 may be higher frequency RF generators (e.g. 13.56 MHz to 120 MHz). Vacuum maintenance, gas delivery and wafer handling equipment 106 may be implemented to complete the system and optionally additional measurement and diagnostic equipment 115 may be present (e.g. optical spectroscopy equipment).

The system controller 116 in the embodiment of FIG. 1 controls the entire system through a system control bus 117. The system control bus 117 can also be used to collect information from equipment of the plasma processing system. In addition to the system control bus 117, there may be dedicated inter-system communication 118 which can be used, for example, to control the source matching network 113 from a source generator 112 or exchange information between subsystems without involving the system control bus 117. There may also be a near-real-time communication link 119 between subsystems. This may take the form of a reference oscillator to phase lock different generators on the system, to provide waveform synchronization signals, arc detection signals, etc. Although a single source generator 112 is common, it is also common to have multiple source generators 112 and multiple bias generators 108 in order to achieve a desired plasma density and desired control over the distribution of ion energies. One or more of the source generators 112 and/or bias generators 108 can modulate the plasma properties and be considered as a modulating supply.

Figure 2:
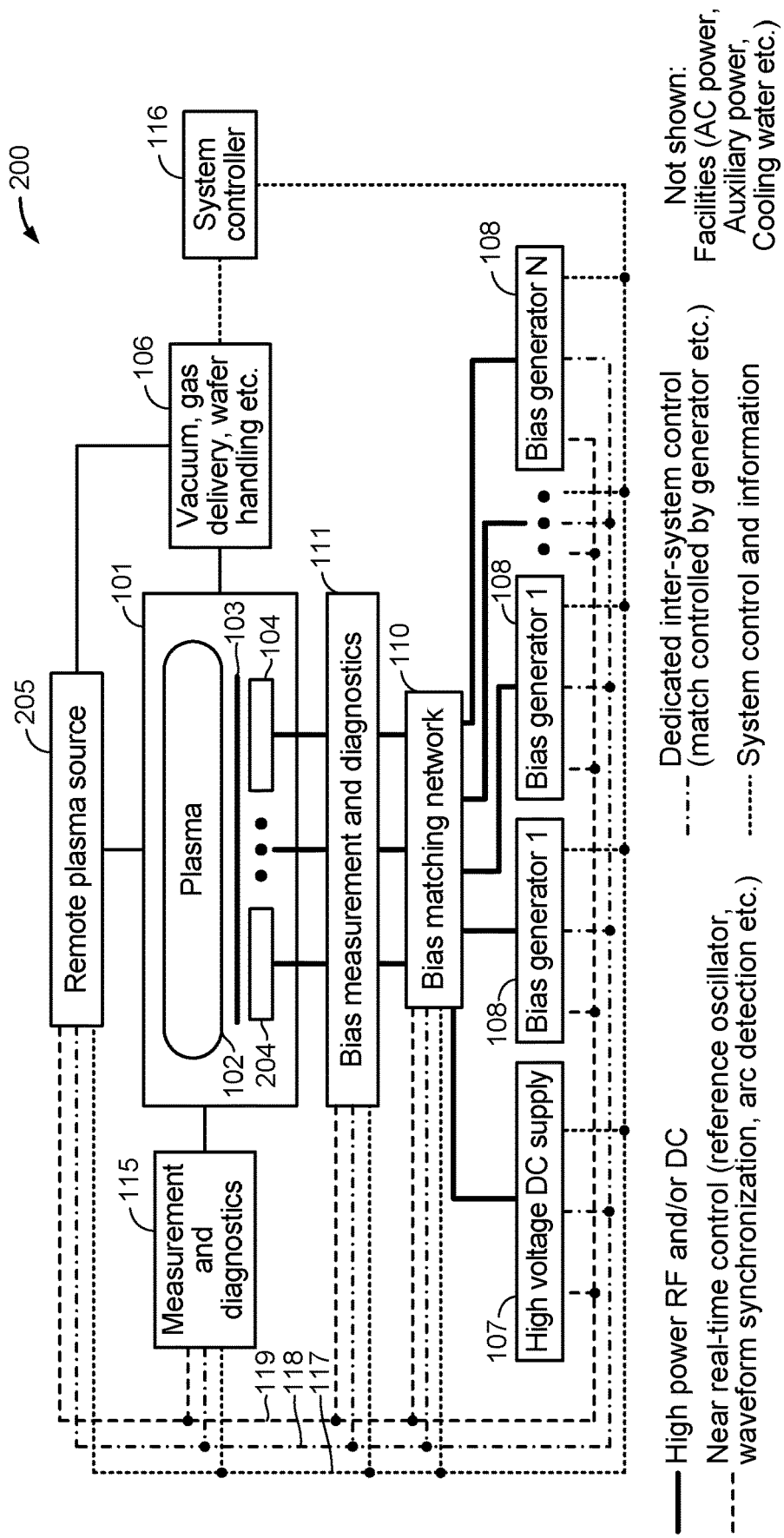
FIG. 2 depicts another embodiment of plasma processing system designed to achieve control over plasma properties using a remote plasma source rather than a source generator or source generators.

FIG. 2 shows an embodiment of a plasma processing system 200 where the source generators 112 are replaced by a remote plasma source 205. As those of ordinary skill in the art will appreciate, the remote plasma source 205 may include an excitation source (e.g., an RF generator) and a plasma-generation chamber configured and disposed to produce a plasma that is provided to the plasma chamber 101. Although the remote plasma source 205 is outside of the plasma chamber 101, the remote plasma source 205 may be coupled to the plasma chamber 101 to form a contiguous volume with the plasma chamber 101. Although unlikely in many embodiments, in some embodiments, the remote plasma source 205 may modulate plasma properties of the plasma 102 in the plasma chamber 101. And if the remote plasma source 205 does modulate the plasma properties of the plasma 102, the remote plasma source 205 and/or one or more of the bias generators 108 can be considered as a modulating supply.

Figure 3:
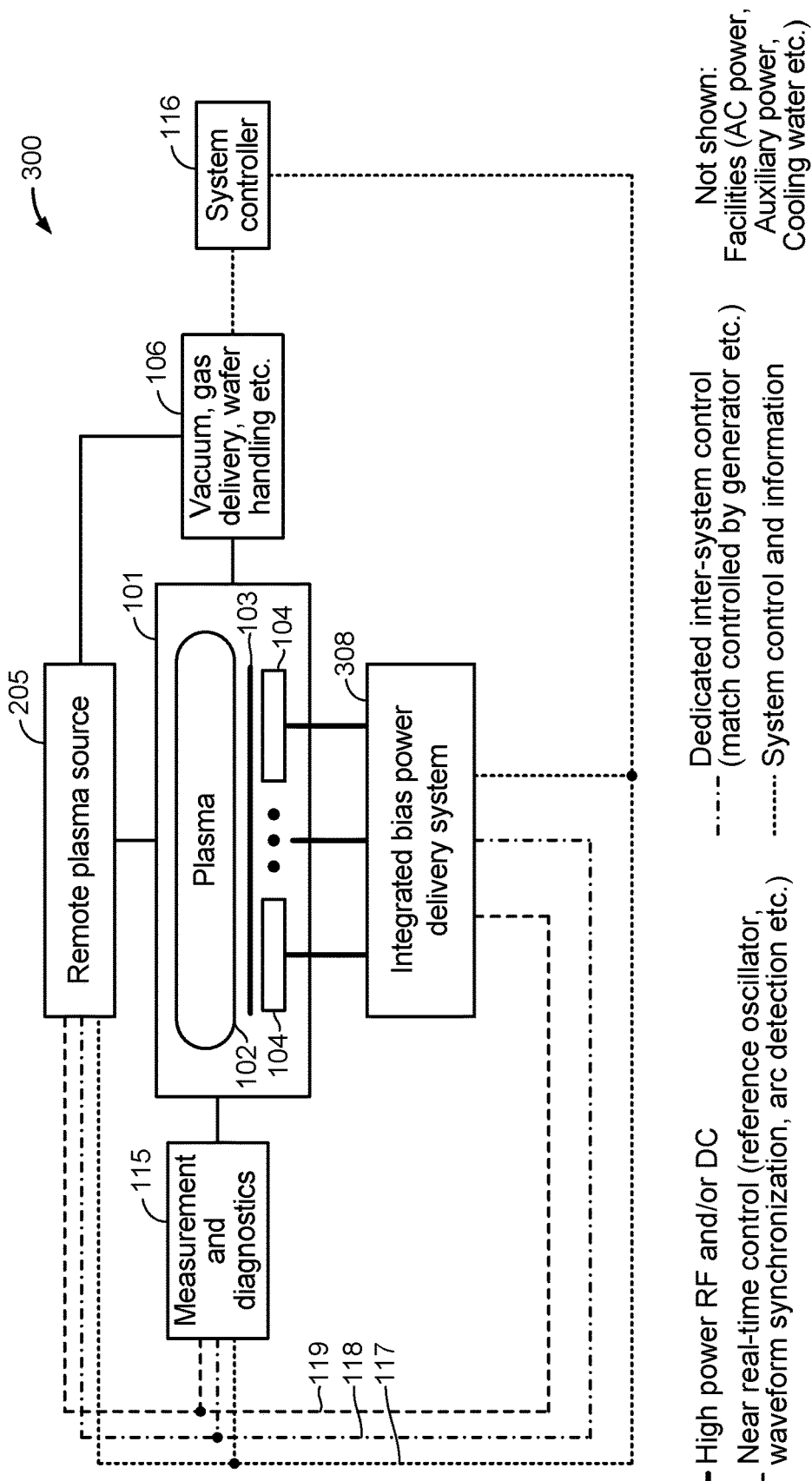
FIG. 3 depicts yet another embodiment of a plasma processing system designed to achieve control over plasma properties using a remote plasma source and an integrated bias power delivery system.

FIG. 3 shows another embodiment of a plasma processing system where multiple bias generators are replaced by an integrated bias power delivery system 308. Such integration can reduce system complexity and reduce duplication by, for example, using common DC power supplies for the RF generators, a common controller, auxiliary power supplies, measurement systems etc., but the output to the plasma chamber 101 is still a combination of a single or multiple RF frequencies and/or a DC signal. Many other variations exist such as, for example, using a source generator and integrated bias power delivery system or using integrated source and bias power delivery systems etc.

Figure 4:
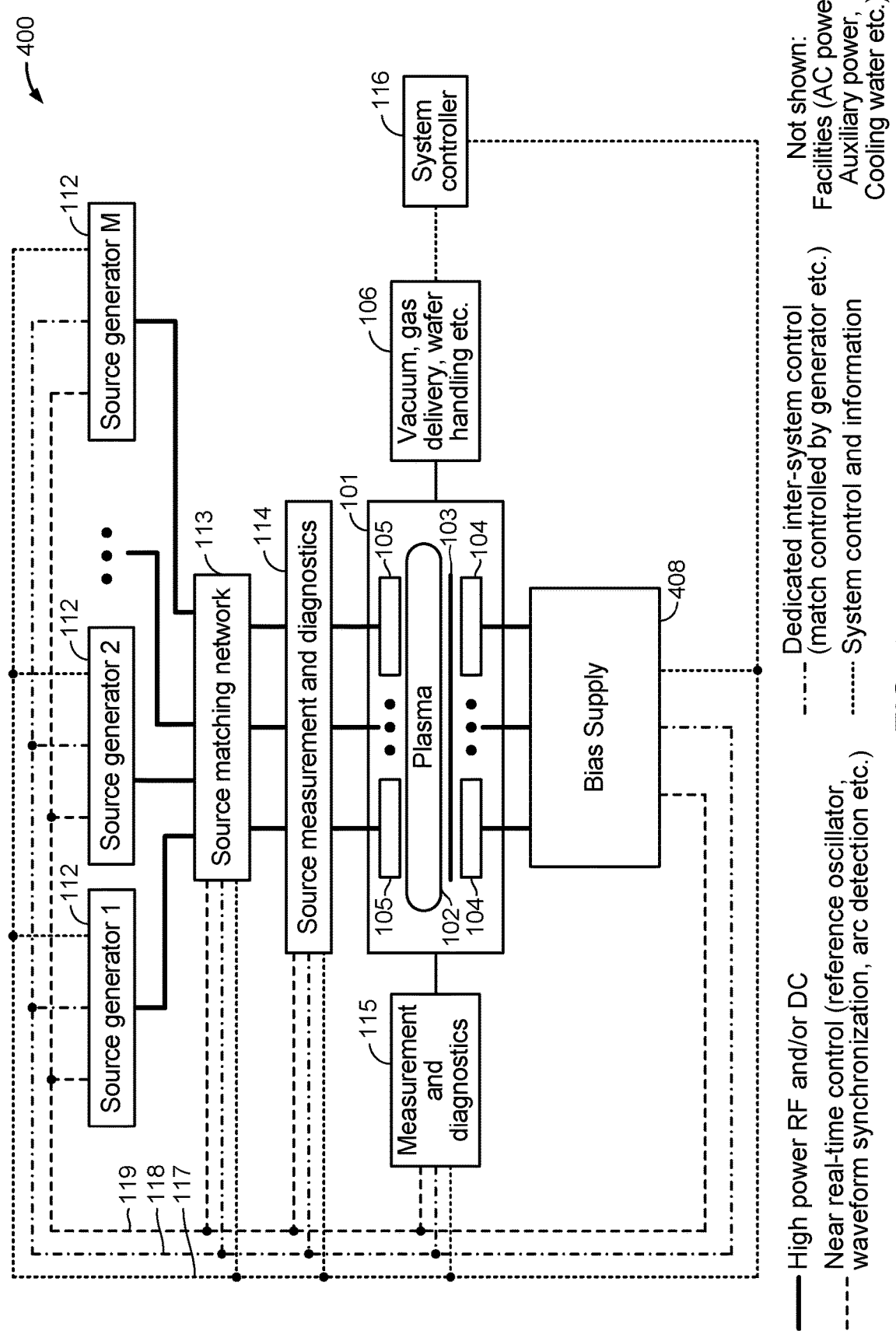
FIG. 4 depicts a plasma processing system that includes a bias supply.
Figure 5:
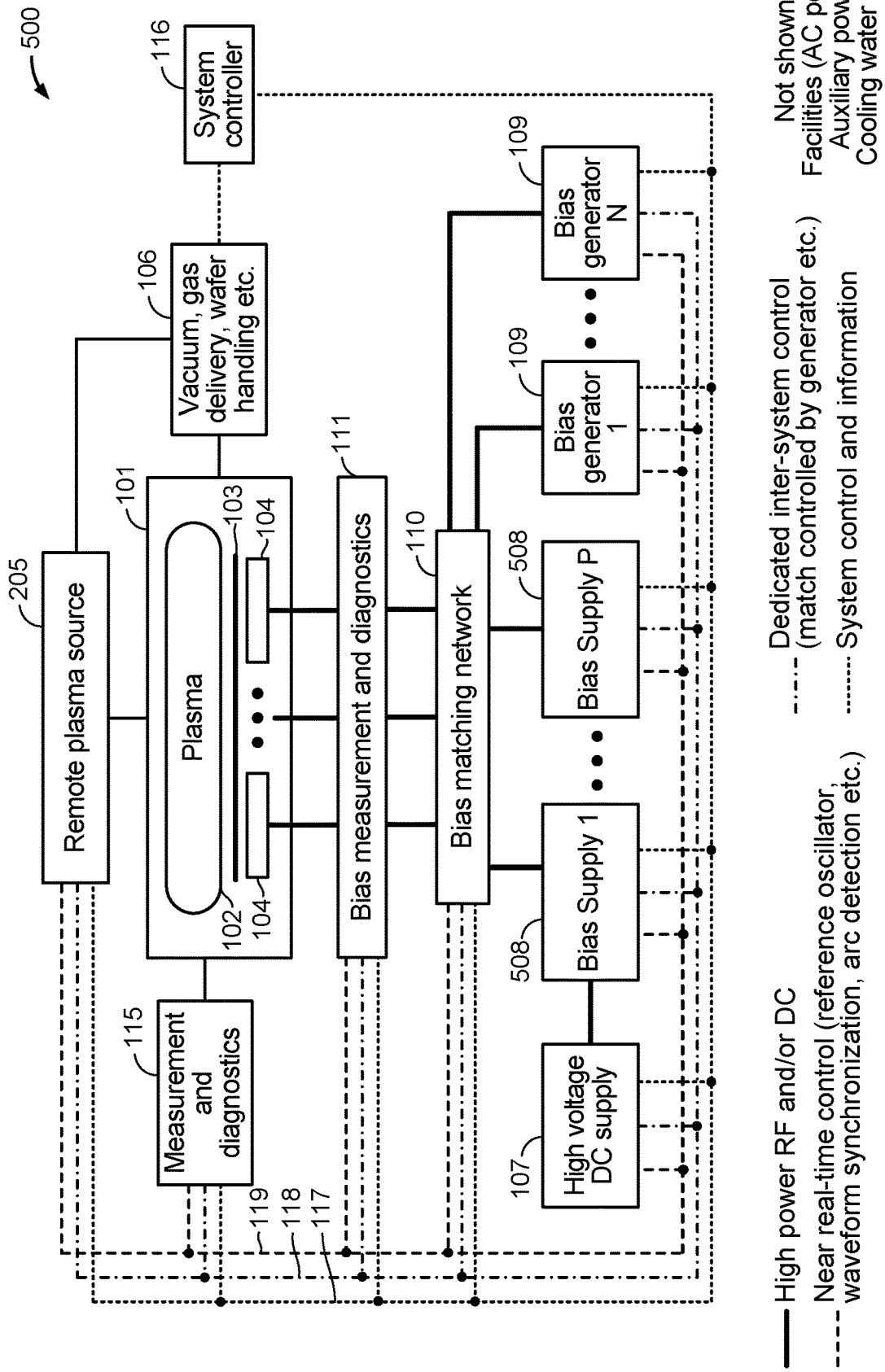
FIG. 5 depicts another implementation of a plasma processing system incorporating multiple bias supplies.

Referring next to FIG. 4, shown is yet another embodiment of a plasma processing system that utilizes a bias supply 408 (instead of bias generators 108) for an even tighter control over the distribution of ion energies. As shown, the bias supply 408 may apply a periodic waveform to several different electrodes 104, or alternatively, a separate bias supply 408 may be coupled to each electrode 104 (not shown in FIG. 4). As shown in FIG. 5, it is contemplated that multiple bias supplies 508 may be utilized in connection with multiple generators 109. It should be recognized that the embodiments described with reference to FIGS. 1-5 are not mutually exclusive and that various combinations of the depicted equipment may be employed.

Figure 6:
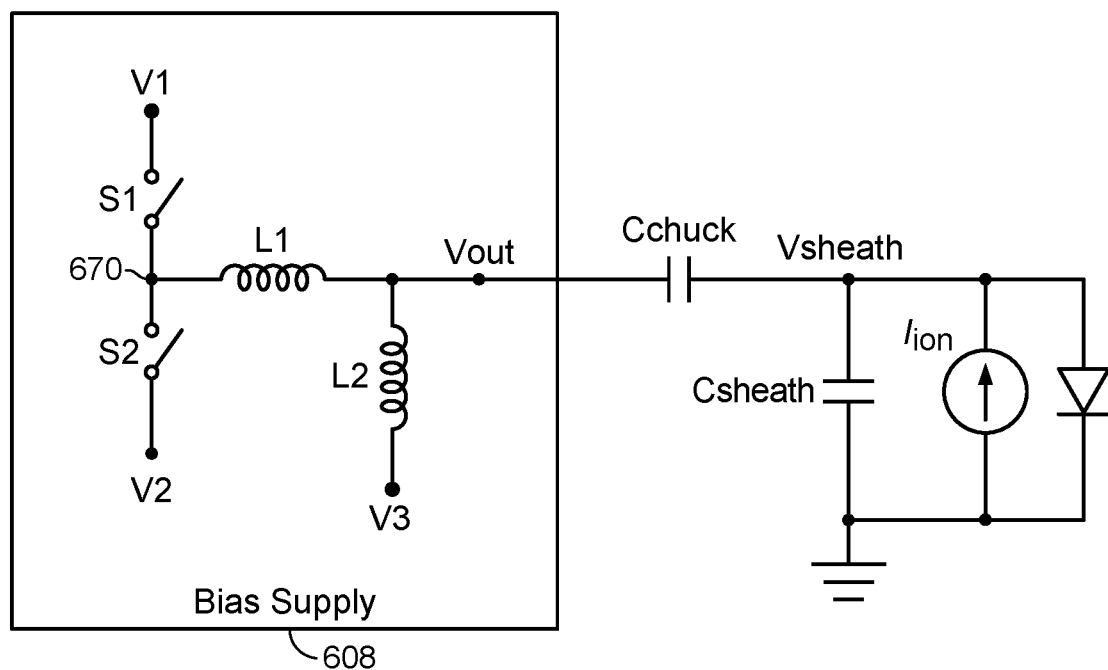
FIG. 6 is a diagram depicting aspects of an exemplary bias supply.

Referring next to FIG. 6, shown is a general representation of an exemplary bias supply 608 that may be used to realize the bias supplies 408, 508. As shown, the bias supply 608 utilizes three voltages V1, V2, and V3. Because the output, Vout, is capacitively coupled through Cchuck, it is generally not necessary to control the DC level of Vout and the three voltages can be reduced to two by choosing one of V1, V2 or V3 to be ground (0V). A separate chucking supply 107 may be used so it is not necessary to control the DC level of Vout. If a separate chucking supply is not used, all three voltages can be controlled to control the DC level of Vout. Although not shown for clarity, the two switches S1, and S2 may be controlled by a switch controller via electrical or optical connection to enable the switch controller to open and close the switches, S1, S2, as disclosed below. The depicted switches S1, S2 may be realized by single pole, single throw switches, and as a non-limiting example, the switches S1, S2 may be realized by silicon carbide metal-oxide semiconductor field-effect transistors (SiC MOSFETs).

In this implementation, the voltages V1, V2, and V3 may be DC-sourced voltages. As shown, the first switch, S1, is disposed to switchably connect the first voltage, V1, to the output, Vout, through and inductive element and the second switch, S2, is disposed to switchably couple the second voltage, V2, to the output, Vout, through an inductive element. In this implementation the two switches connect to a common node, 670, and a common inductive element, L1, is disposed between the common node and an output node, Vout. Other arrangements of the inductive elements are possible. For example, there may be two separate inductive elements with one inductive element connecting S1 to Vout and another connecting S2 to Vout. In another example one inductive element may connect S1 to S2 and another inductive element may connect either S1 or S2 to Vout.

Figure 7:
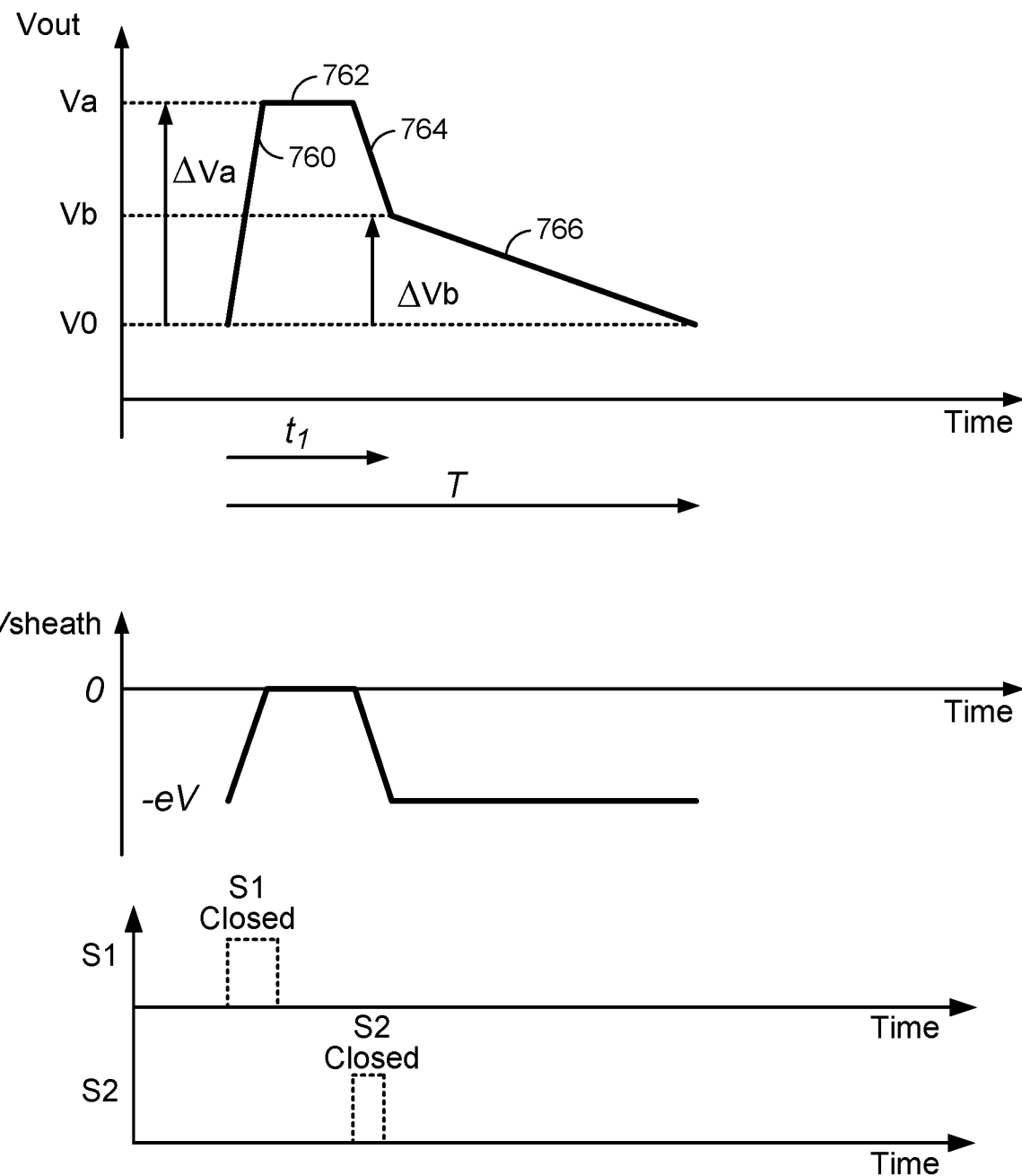
FIG. 7 includes a graph of a voltage waveform output from a bias supply; a graph of a corresponding sheath voltage; and a corresponding switch-timing diagram.

While referring to FIG. 6, simultaneous reference is made to FIG. 7, which depicts: 1) the voltage waveform of the bias supply 608 that is output at Vout; 2) a corresponding sheath voltage; and 3) corresponding switch positions of switches S1 and S2. In operation, the first switch, S1, is closed momentarily to increase, along a first portion 760 of the voltage waveform (between voltage V0 and Va) a level of the voltage at the output node, Vout, to a first voltage level, Va. The level Va is maintained along a second portion 762 of the waveform. The second switch, S2, is then closed momentarily to decrease, along a third portion 764 of the waveform, the level of the voltage waveform at the output node, Vout, to a second voltage level, Vb. Note that S1 and S2 are open except for short periods of time. As shown, the negative voltage swing along the third portion 764 affects the sheath voltage (Vsheath); thus, a magnitude of Va-Vb may be controlled to affect the sheath voltage.

In this embodiment the third voltage, V3, is applied to the output node, Vout, through a second inductive element L2 to further decrease a level of the voltage at the output node along a fourth portion 766 of the voltage waveform. As shown in FIG. 7, the negative voltage ramp along the fourth portion 766 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 760 of the voltage waveform to a first voltage level, Va, and the first voltage level, Va, is sustained along the second portion of the waveform 762. The first voltage level Va may be above the first voltage, V1, and the second voltage, V2, (e.g., ground) may be less than the first voltage level, Va. The momentary connecting and then disconnecting of the second voltage, V2, causes the voltage of the output, Vout, to decrease at the third portion 764 to the second voltage level Vb that is below the second voltage, V2 (e.g., ground).

As an example, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 6 and 7.

Figure 8A:
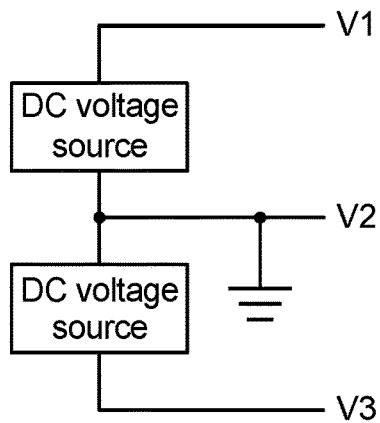
FIG. 8A depicts an implementation using two voltage sources to provide voltages to the bias supply depicted in FIG. 11.
Figure 8B:
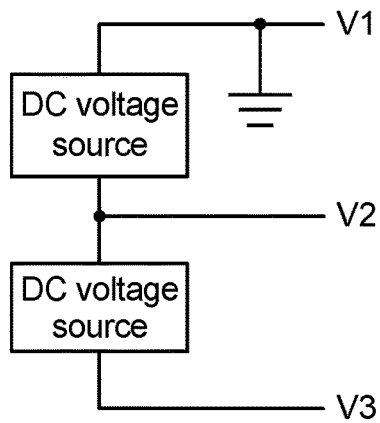
FIG. 8B depicts another implementation using two voltage sources to provide voltages to the bias supply depicted in FIG. 11.
Figure 8C:
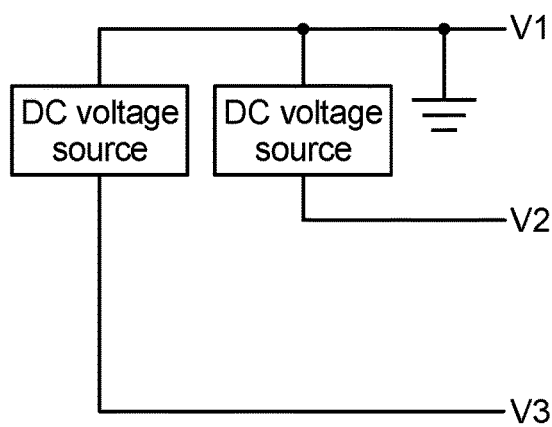
FIG. 8C depicts yet another implementation using two voltage sources to provide voltages to the bias supply depicted in FIG. 11.

Referring next to FIGS. 8A-8C shown are possible arrangements of two DC voltage sources to provide the voltages V1, V2, and V3 depicted in FIG. 6. In FIG. 8A, V2 is grounded and forms a common node between the two DC voltage sources. In FIG. 8B, V1 is grounded and V2 forms a common node between the DC voltage sources. And in FIG. 8C, V1 is grounded and forms a common node between each of the two DC voltage sources.

Figure 9A:
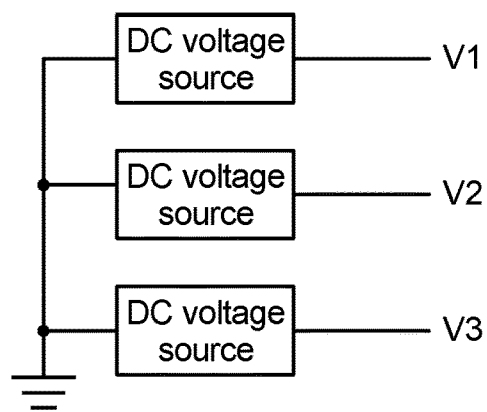
FIG. 9A depicts an implementation using three voltage sources to provide voltages to the bias supply depicted in FIG. 11.
Figure 9B:
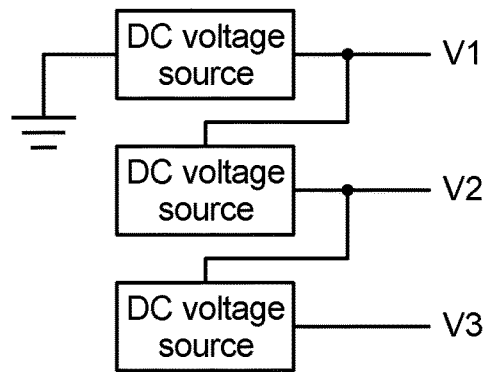
FIG. 9B depicts another implementation using three voltage sources to provide voltages to the bias supply depicted in FIG. 11.
Figure 9C:
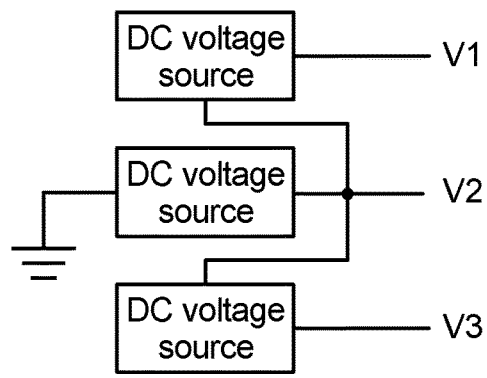
FIG. 9C depicts yet another implementation using three voltage sources to provide voltages to the bias supply depicted in FIG. 11.

In some embodiments, as shown in FIGS. 9A, 9B, and 9C, three DC voltage sources may be utilized to apply the three voltages V1, V2, and V3. As shown in FIG. 9A, each of the three DC voltage sources may be coupled to ground, and each of the three DC voltage sources provides a corresponding one of V1, V2, V3. In FIG. 9B one of the DC voltages sources is grounded and the three DC voltage sources are arranged in series. In FIG. 9C, one of DC voltages sources is disposed between ground and V2, and each of the DC voltage sources is coupled to V2.

The bias supply 608 depicted in FIG. 6 is merely an example of a bias supply 608 that may produce an output at Vout as shown in FIG. 7. Other variations are shown and described the incorporated-by-reference patents referred to earlier herein. Also disclosed in the incorporated-by-reference patents are different modulation schemes that may be applied to the basic source waveform (at Vout) to achieve a desired distribution of ion energies and to control average power applied to the plasma chamber by the bias supply.

One modulation scheme includes modulating the third portion 764 of the voltage waveform to effectuate desired ion energies of ions impinging upon the workpiece 103 in the plasma chamber 101. As an example, the bias supply 408, 508, 608 may alternate a magnitude of the third portion 764 of the voltage waveform between two or more levels to effectuate an alternating surface potential of the workpiece 103 in the plasma between two or more distinct levels. As another example, a slope of the fourth portion 766 of the voltage waveform may be adjusted to change a level of current that is provided to an electrode 104 (to compensate for ion current that impinges upon the workpiece 103) to achieve a desired spread of ion energies (e.g., around a center ion energy). Successful use of bias supplies 408, 508, 608 as a bias generator in many plasma processing systems requires careful system design.

System Synchronization and Communication

Modulating supplies such as the source generators 112, bias generators 108, remote plasma sources 205, and bias supplies 408, 508, 608 can cause strong modulation of plasma properties. Examples of plasma properties, without limitation, include an impedance presented by the plasma, plasma density, sheath capacitance, and a surface potential of the workpiece 103 in the plasma 102. As discussed above, the modulation of the voltage and/or current applied by the bias supplies 408, 508, 608 is one potential cause of modulating plasma properties.

Source generators 112 may also modulate plasma properties by modulating electromagnetic fields impacting the plasma 102. In particular, source generators may pulse the power (e.g., RF power) that is applied by a source generator 112. Moreover, a magnitude of voltage of the power applied by a source generator 112 may be changed. The addition of one or more additional source generators 112 adds additional complexity. And it is also contemplated that one or more bias supplies 408, 508, 608 may modulate the voltage (Vout shown in FIG. 6), and hence sheath voltage, while a source generator 112 is applying pulsed power. Thus, control over plasma properties (e.g., plasma density and ion energy) is challenging, and spatial control over the plasma properties is especially challenging.

As discussed above, a remote plasma source 205 may replace, or augment, a source generator 112. But remote plasma sources 205 may also be modulating supplies that are configured to modulate plasma properties by modulating properties of gases in the plasma chamber 101.

In addition to control challenges, one modulating supply may affect (e.g., in an adverse manner) operation of another modulating supply. As a specific, non-limiting, example, the bias supplies 408, 508, 608 may impart power at a level that results in plasma modulation, which in turn, cause undesirable changes in the load impedance presented to a source generator 112. In addition, strong plasma modulation can also cause aliasing of measurements of plasma properties. The aliasing may prevent accurate measurements of forward and reflected power; thus, preventing an operator from detecting damaging power levels and/or prevent proper control over at least one of the source matching network 113 or the bias matching network 110.

Synchronization of equipment connected to the plasma system may mitigate the adverse effects of plasma modulation (e.g., damaging power and aliasing), and as a consequence, synchronization is highly desired. But the complex, time varying, aspects of plasma modulation (e.g., resulting from potentially many modulating supplies) can make synchronization difficult.

Figure 10:
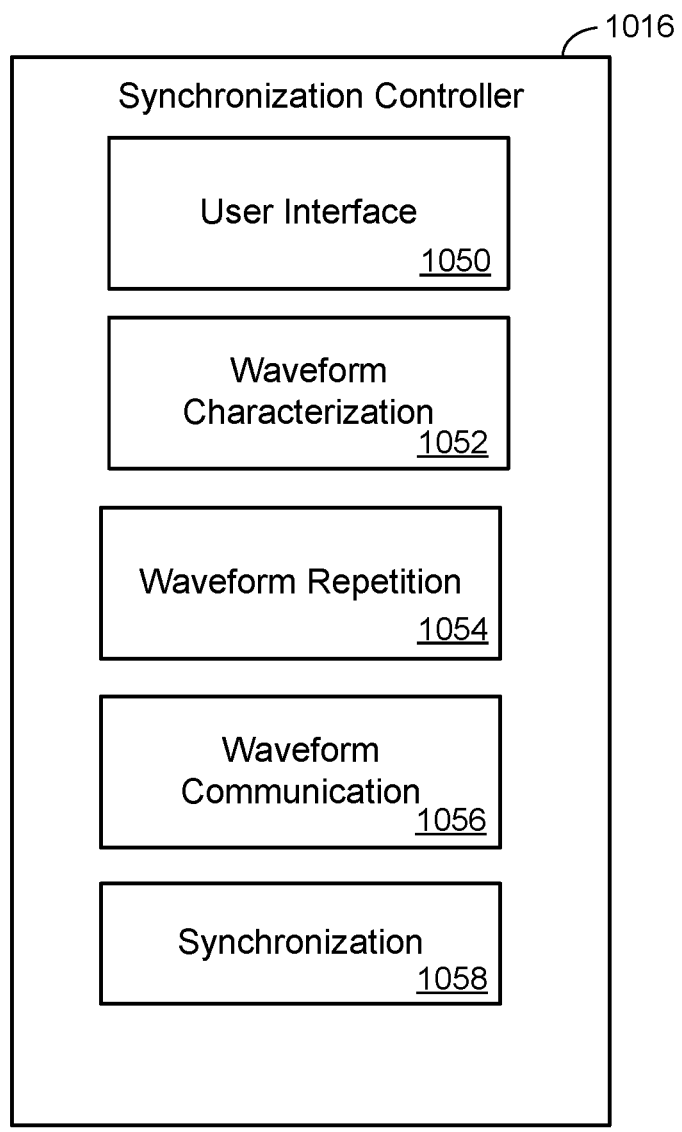
FIG. 10 is a block diagram depicting a synchronization control component.

Referring to FIG. 10, shown is a synchronization controller 1016 that is configured to synchronize constituent equipment of a plasma processing system that may include modulating supplies and other equipment that does not modulate the plasma 102. As shown, the synchronization controller 1016 includes a user interface 1050, a waveform-characterization module 1052, a waveform-repetition module 1054, a waveform-communication module 1056, and a synchronization module 1058.

The depicted components of the synchronization controller 1016 may be realized by hardware, firmware, software and hardware or combinations thereof. The functional components of the synchronization controller 1016 may be distributed about the plasma processing system and duplicated in equipment that is connected to the plasma processing system. And as discussed further herein, the synchronization controller 1016 may be implemented as a master device or slave device.

The user interface 1050 enables an operator to interact with the plasma processing system so that the operator may control aspects of the synchronization and the operator may receive information about conditions of the equipment and the plasma chamber 101. The user interface 1050 may be realized, for example, by one or more of a touch screen, pointing device (e.g., mouse), display, and keyboard.

The waveform-characterization module 1052 is generally configured to generate a waveform dataset that characterizes a waveform (e.g., a waveform of a modulation of the plasma or a waveform output (or desired to be output) by equipment) of the plasma processing system. The waveform-repetition module 1054 is configured to determine a repetition period, T, for a piece of equipment connected to the plasma system, and the waveform-communication module 1056 is configured to communicate the waveform dataset to at least one of the piece of equipment or another piece of equipment connected to the plasma processing system. The synchronization module 1058 is configured to send a synchronization pulse with a synchronization-pulse-repetitionperiod (which is an integer multiple of T) to one or more pieces of equipment connected to the plasma system.

Figure 11:
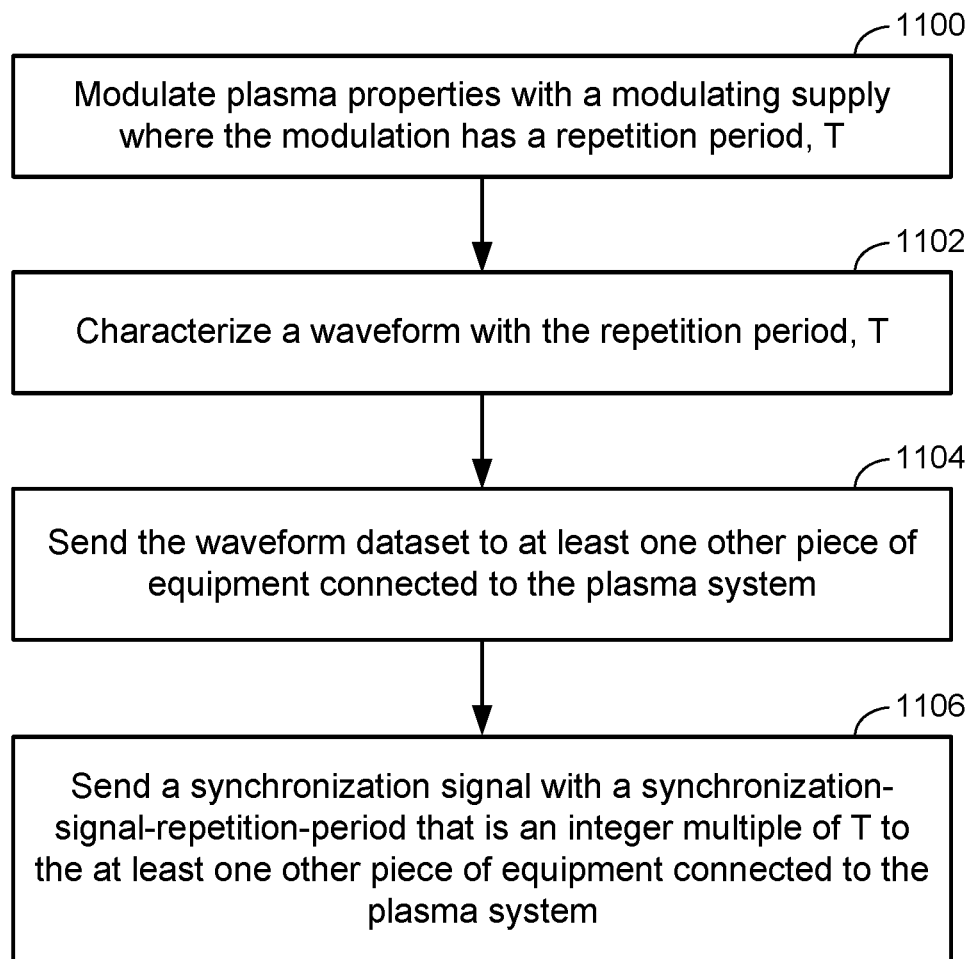
FIG. 11 is a method that may be traversed using the synchronization control component.

While referring to FIG. 10, simultaneous reference is made to FIG. 11, which is a flowchart depicting a method that may be traversed in connection with a plasma processing system and the synchronization controller 1016. As shown, plasma properties are modulated with a modulating supply where the modulation has a repetition period, T (Block 1100). It should be recognized that in many embodiments T is the repetition period of the plasma modulation—not a cycle period of the modulating supply. As a consequence, the modulating supply may have an output with a repetition period that is different than the modulation of the plasma properties. For example, the modulating supply may have a repetition period of 200 microseconds and another modulating supply may have a repetition period of 500 microseconds resulting in the plasma 102 being modulated with a 1 millisecond repetition period, T. In some embodiments, T is a shortest length of time for which waveforms of all pieces of equipment that modulate the plasma properties of the plasma processing system is periodic with period, T.

As shown in FIG. 11, the waveform characterization module 1052 may characterize a waveform with a repetition period, T, containing at least one of information about the modulation of the plasma or a desired waveform of a piece of equipment connected to the plasma processing system to produce a waveform dataset (Block 1102).

Figure 12:
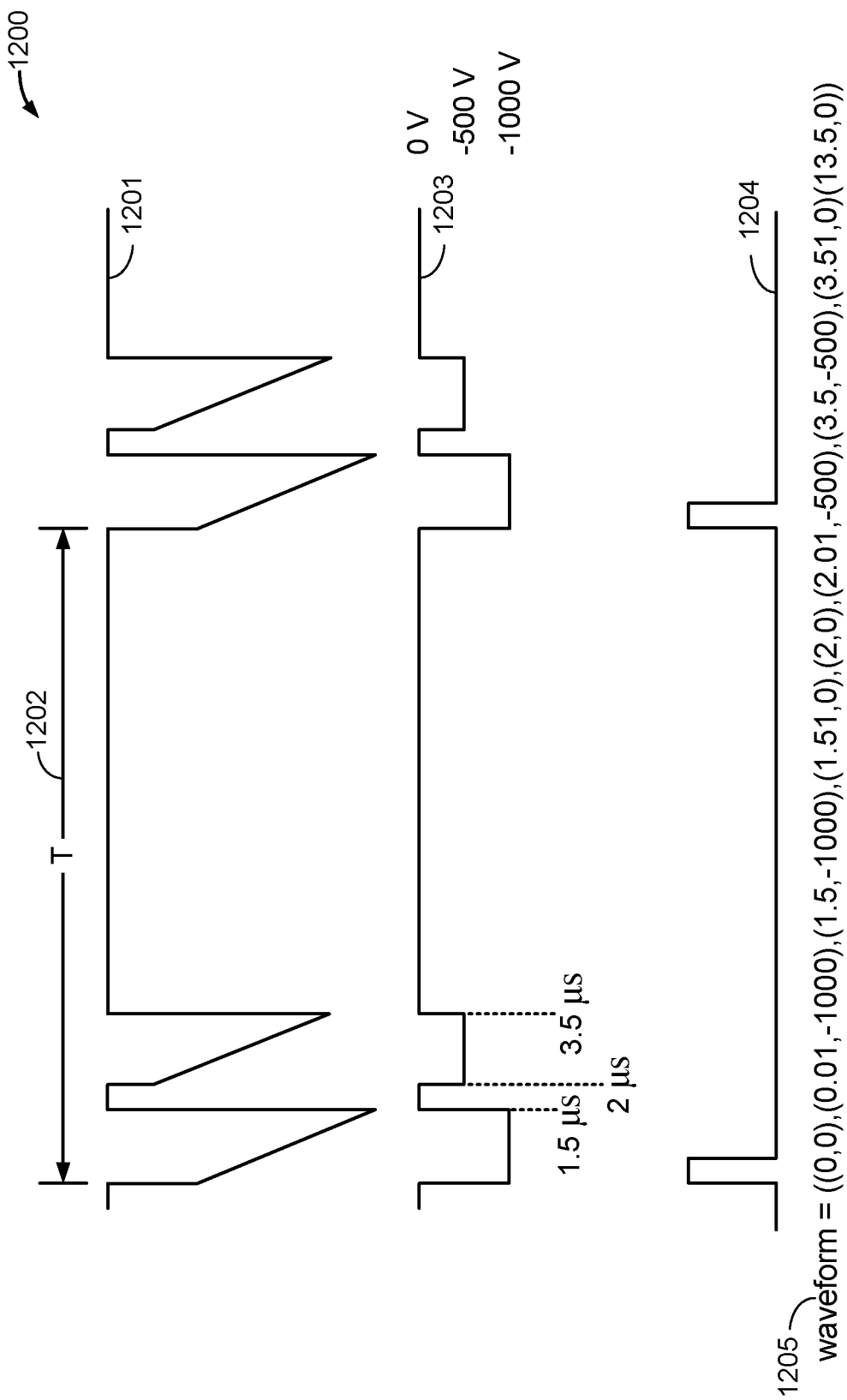
FIG. 12 depicts aspects of synchronizing a modulating supply with other equipment connected to plasma processing system.

Referring briefly to FIG. 12, shown are: an exemplary output waveform 1201 of the bias supply 408, 508, 608; a waveform 1203 corresponding to is a calculated effective voltage at the surface of the workpiece 103; a corresponding synchronization signal 1204; and information about the waveform in the form of a waveform dataset 1205. In FIG. 12, an output waveform 1201 is the actual output of the bias supply bias supply 408, 508, 608 (at Vout) with a fundamental period, T, 1202. The waveform 1203 is a calculated effective voltage at the surface of the workpiece 103 (e.g., a sheath voltage that is the voltage of the workpiece 103 relative to the plasma 102). Also shown is a synchronization pulse 1204 (also referred to as a synchronization signal 1204) with a synchronization-signal-repetition-period that is an integer multiple of T. And the waveform dataset 1205 that includes information about the waveform 1203; thus, a characterized waveform (represented in FIG. 12) is the waveform 1203. It should be recognized that the waveform 1203 represents an alternating surface potential of the workpiece between two or more distinct levels (e.g., −500V and −1000V), but this is only an example and is not required. Alternatively, the characterized waveform may be an output waveform generated by a modulating supply, which in FIG. 12 is the output waveform 1201 of the bias supply 408, 508, 608. In yet another implementation, the characteristics of the waveform with a repetition period T include characteristics of the plasma properties such as plasma density, sheath capacitance, sheath potential, etc.

Referring again to FIG. 11, the waveform dataset 1205 is sent by the waveform-communication module 1056 to the at least one piece of equipment connected to the plasma system (Block 1104), and the synchronization module 1058 sends the synchronization signal 1204 with a synchronization-signal-repetition-period (which is an integer multiple of T) to at least one piece of equipment connected to the plasma system (Block 1106). This method enables synchronization of pieces of equipment connected to the plasma processing system where the characterized waveform contains at least one of information about the modulation of the plasma or information about a desired waveform of a piece of equipment connected to the plasma processing system. It should be recognized that the waveform dataset may be communicated to a receiving-piece of equipment to control the receiving-piece of equipment (e.g., by directing the receiving-piece of equipment to provide a desired waveform). Or the waveform dataset may be informational (e.g., to provide information about the modulation of the plasma or to provide information about an output of a modulating supply).

Although FIG. 12 depicts a specific example of a modulating supply that applies power with a waveform that enables control over ion energy in a region proximate to an electrode 104, the waveform characterization (Block 1106) is generally applicable to other waveforms that may represent aspects of plasma-related modulation (e.g., plasma density, plasma impedance, ion flux, etc.) or aspects of power applied by other equipment. For example, equipment coupled to the plasma processing system may include RF and DC generators, and in some implementations, the generator(s) are able to absorb power from the plasma processing system. It is also contemplated that in some embodiments one or more generators are a load that can only absorb power from the plasma processing system. Generators that are able to absorb power are useful for controlling spatial properties of an electromagnetic field in a plasma chamber by, e.g., avoiding standing waves in the chamber.

One or more of the source generators 112 may synchronize a property of the output of the source generator(s) 112 with the characterized waveform (that has the repetition period T). The property of the output of the source generator(s) 112 may be at least one of voltage, current, power, frequency, or generator source impedance. And the output of the source generator(s) 112, for example, may include (within one repetition period) pulsed power followed by continuous wave power. And the waveform dataset may include a time series of values indicating one or more aspects of power (e.g., voltage, current, phase, etc.) for the repetition period. The source generator 112 may synchronize pulsing with a particular waveform applied by the bias supply 408, 508, 608 that may, for example, modulate a magnitude of the negative voltage swing (the third portion 764) in a different manner while the source generator 112 is pulsing as compared to when the source generator 112 is operating in a continuous-wave mode of operation. This use case is only an example, and various other types of processing steps may prompt synchronization among pieces of plasma processing equipment.

In addition, the source generator 112 may advance or delay changes in a property of the output of the source generator 112 with respect to changes in the characterized waveform with a repetition period T. As discussed above, the characterized waveform in some implementations may characterize the modulation of the plasma properties. The characterized waveform may also characterize a waveform of the source generator 112 or another modulating supply (depending upon how the source generator 112 is configured to operate).

The equipment coupled to the plasma processing system (and synchronized as disclosed herein) is certainly not limited to modulating supplies. For example, the at least one piece of equipment that the dataset is sent to (Block 1104) may include equipment that is configured to measure properties of the plasma processing system. For example, the measurements may include at least one of a measurement of plasma properties, properties of power delivered to the plasma system, or properties of gas delivered to the plasma system. By way of further example, the equipment that is configured to measure properties may include one or more of the source measurement and diagnostics system 114 and the bias measurement and diagnostics system 111. Those of ordinary skill in the art recognize that the source measurement and diagnostics system 114 and the bias measurement and diagnostics system 111 may include one or more sensors (e.g., directional couplers and/or VI sensors) in connection with hardware to sample and analyze properties of power delivered to the plasma system (which may be used to measure plasma impedance as a plasma property). In the context of a plasma processing system utilizing the remote plasma source 205, properties of the gas delivered to the plasma processing system may be measured (e.g., utilizing optical or other measurement techniques). As discussed herein, plasma modulation can cause aliasing of measurements of plasma properties, so synchronizing measurements to within time windows to avoid misleading transient values (or during time windows where modulation is at a local minima) is beneficial.

Other equipment that may be synchronized includes matching networks. For example, the impedance matching network may synchronize measurements indicative of impedance with the characterized waveform. By synchronizing the measurements with time windows where measurements are not misleading (e.g., when there not large changes in power levels applied to the plasma), matching may be improved. Examples of impedance matching networks include the source matching network 113 and the bias matching network 110.

The waveform dataset 1205 may be sent (Block 1104) via digital communication link to one or more of the pieces of equipment coupled to the plasma processing system. The communication link may include the system control bus 117, which may be realized by known digital links (for example, without limitation, ethernet). In many implementations, the waveform dataset 1205 may be communicated once, and then the synchronization pulse prompts each piece of equipment to operate in response to the waveform dataset in a repeating manner.

The synchronization signal may be sent (Block 1106) via the near-real-time communication link 119 to equipment coupled to the plasma processing system. As an example, the near-real-time link may be an analog communication link to provide a single analog output with an identifiable fundamental pulse (also referred to as a "tick")), and if required, update pulses (also referred to as "update-ticks") are sent in between the fundamental pulses. In addition, the synchronization signal may include an indication of a start of the synchronization signal repetition period as well as at least one indication that a period of time since the start of the synchronization signal repetition period has elapsed.

The start of the synchronization signal repetition period may be indicated by a pulse of a first duration and the indication that a period of time since the start of the synchronization signal repetition period has elapsed may be indicated by a pulse of a second duration that is different from the first duration. For example, the first duration may be longer than the second duration or vice versa.

In some implementations, the synchronization signal includes an indication of the start of the synchronization signal repetition period where the start of the synchronization signal repetition period is further modified at least once to indicate a time of day or to indicate that a new waveform is taking effect.

Figure 13:
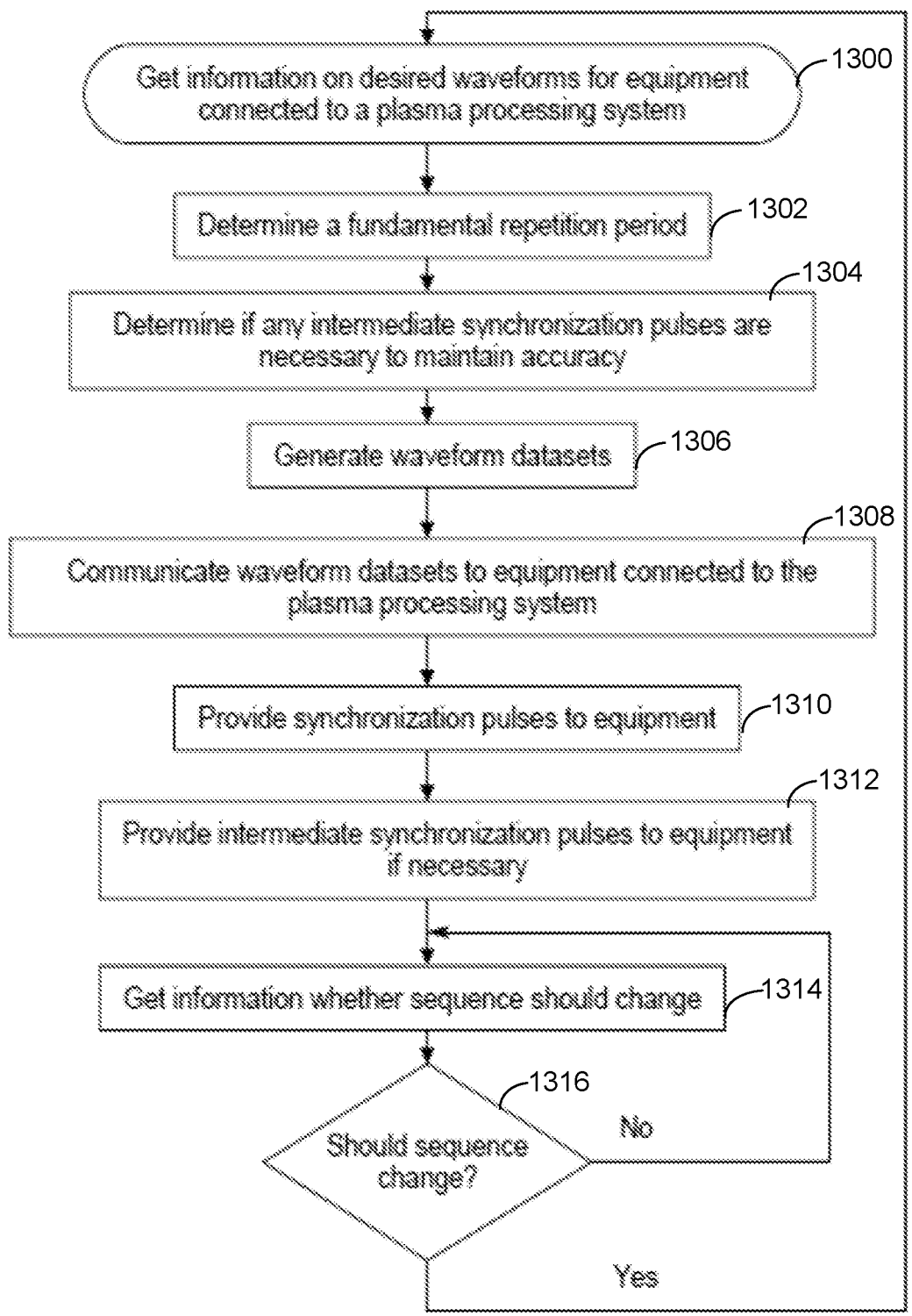
FIG. 13 is a flowchart depicting an exemplary method that may be executed from a master device.
Figure 14:
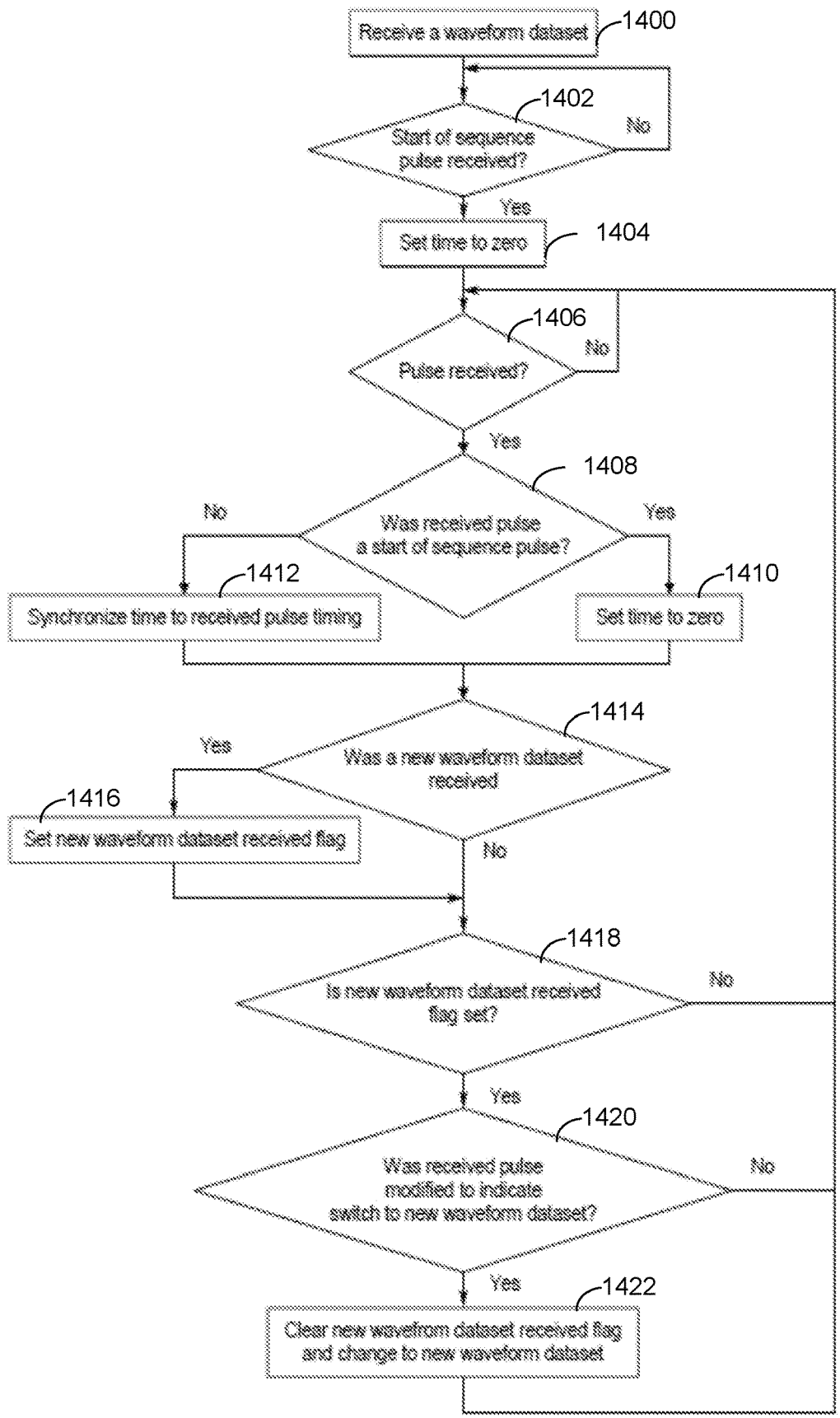
FIG. 14 is a flowchart depicting an exemplary method that may be executed by a slave device.

Referring to FIGS. 13 and 14 shown are flowcharts depicting activities carried out at a master piece of equipment and activities carried out at a slave piece of equipment, respectively. As shown in FIG. 13, at a master piece of equipment, information on desired waveforms for equipment connected to the plasma processing equipment is obtained (Block 1300), and a fundamental repetition period is determined (Block 1302). A determination is also made to establish whether any intermediate synchronization pulses are necessary to maintain accuracy (Block 1304). Waveform datasets are generated (Block 1306) and then communicated to equipment connected to the plasma processing system (Block 1308). In addition, synchronization pulses are provided to equipment connected to the plasma processing system (Block 1310). As shown, intermediate synchronization pulses are provided to equipment if necessary (Block 1312). And information about whether a sequence should change is also obtained (Block 1314), and if the sequence should change (Block 1316), then the activities described above with reference to Blocks 1300 to 1314 are performed again.

As shown in FIG. 14, at a slave piece of equipment, a waveform dataset is received (Block 1400), and the slave then waits for a start-of-sequence pulse to be received (Block 1402) before setting a time to zero (Block 1404). The slave equipment then waits for a pulse to be received (Block 1406) and determines whether or not the pulse was a start-of-sequence pulse (Block 1408), and if so, a time is set to zero (Block 1410). If the received pulse is not a start-of-sequence pulse (Block 1408), then the time is synchronized to a timing of the received pulse (Block 1412). As shown, if a new waveform dataset is received (Block 1414), then a new-waveform-dataset-received-flag is set (Block 1416). If the new-waveform-dataset-received-flag is set (Block 1418) and the received pulse is modified to indicate a change to a new dataset (Block 1420), then the new-waveform-dataset-received-flag is cleared and the new waveform dataset is utilized (Block 1422).

By utilizing precision oscillators, synchronization can be maintained with good precision. For example, using 50 ppm oscillators in all equipment, a change in a waveform can be predicted with better than 50 ns accuracy for a fundamental pulse repetition rate as low as 10 kHz. For longer pulse repetition periods one can add additional synchronization pulses every 100 µs to maintain synchronization within 50 ns accuracy.

Synchronization between a source generator 112 and bias supply 408, 508, 608 may entail lowering voltage or cutting off voltage at the end of a given bias supply pulse. For example, it may be desirable to avoid ending an RF pulse in the midst of a bias supply pulse. Alternatively, pulsing or periodic reductions in voltage, may start and end at the same point/phase in the bias supply pulse, but for different pulses. In other words, it may be desirable to set the pulse on length equal to an integer number of bias supply pulses, whether or not the envelope pulse is in phase with a start or end to an individual bias supply pulse.

The previously described embodiments provide novel and nonobvious systems and methods to create laminate films, among other use cases. Examples such as diamond like carbon, which when deposited with plasma processing has very high stresses that can result in peeling of the film, can now be processed to incorporate low stress graphite or amorphous carbon layers so that the overall film still exhibits diamond like carbon properties but at lower stresses. In some films, it may be desirable to deposit the film in one period followed by a period where the plasma chemistry is modified by pulsing control and a high bias is applied to densify the film. Aspects described herein enable production of nano-level "Bragg" structures consisting of alternative layers with different optical properties produced by combining pulsing and bias voltage control in each respective period as illustrated earlier. Said another way, a first chemistry can be achieved for a first period of time to deposit a first layer, then a second chemistry can be achieved for a second period of time to deposit a second layer. This can be repeated numerous times to achieve a "Bragg" structure. The different chemistries can be achieved by variations in one or more of: bias voltage; duty cycle of two or more bias voltages; alterations in the timing of bias voltage; source pulsing; duty cycle of source pulsing; source voltage; and source voltage and pulsing in combination.

Figure 15:
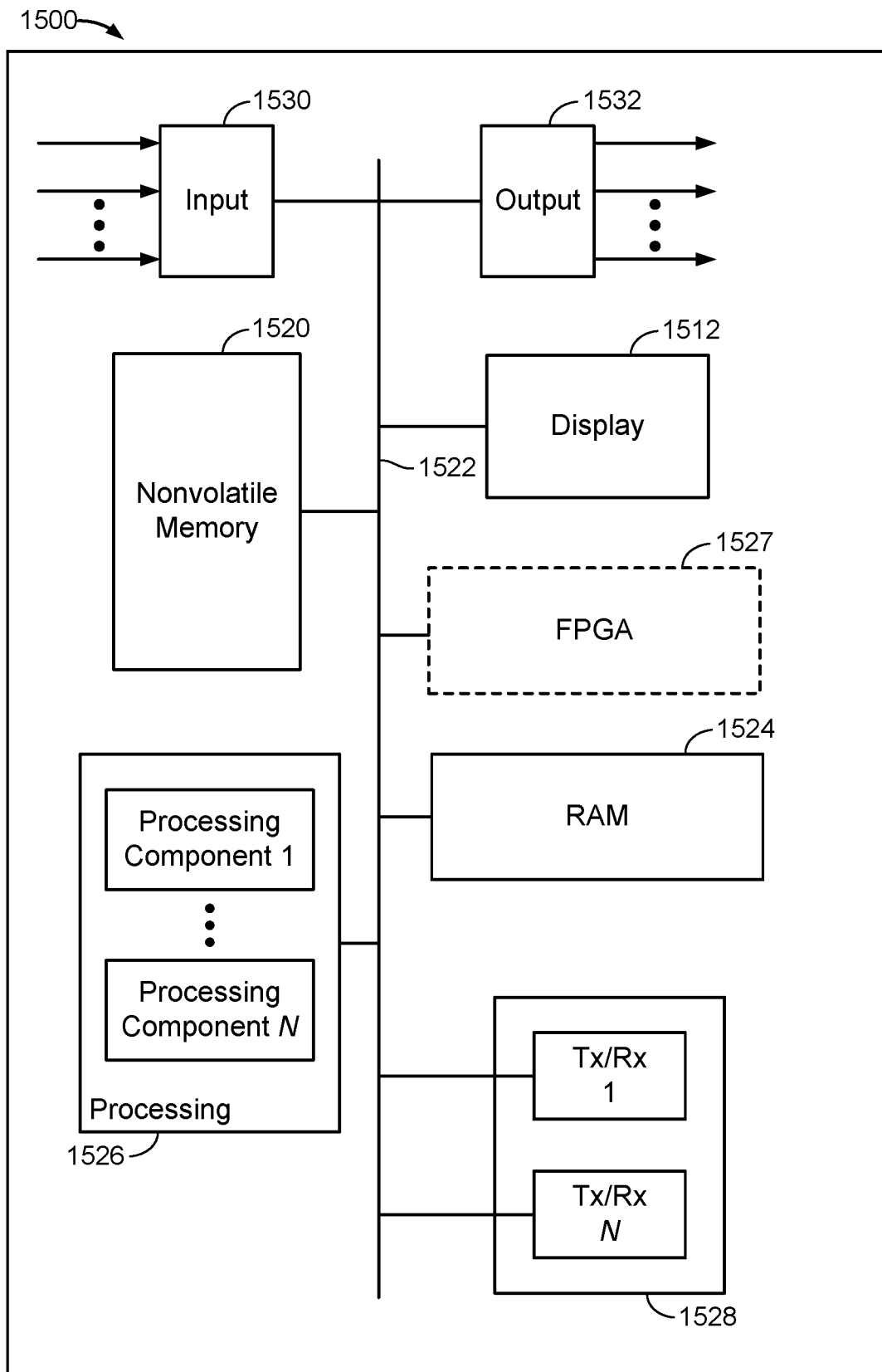
FIG. 15 is a block diagram depicting components that may be utilized to implement control aspects disclosed herein.

The methods described in connection with the embodiments disclosed herein may be embodied directly in hardware, in processor-executable code encoded in a non-transitory tangible processor readable storage medium, or in a combination of the two. Referring to FIG. 15 for example, shown is a block diagram depicting physical components that may be utilized to realize synchronization logic that may be implemented in equipment coupled to the plasma processing systems disclosed herein. As shown, in this embodiment a display portion 1512 and nonvolatile memory 1520 are coupled to a bus 1522 that is also coupled to random access memory ("RAM") 1524, a processing portion (which includes N processing components) 1526, an optional field programmable gate array (FPGA) 1527, and a transceiver component 1528 that includes N transceivers. Although the components depicted in FIG. 15 represent physical components, FIG. 15 is not intended to be a detailed hardware diagram; thus many of the components depicted in FIG. 15 may be realized by common constructs or distributed among additional physical components. Moreover, it is contemplated that other existing and yet-to-be developed physical components and architectures may be utilized to implement the functional components described with reference to FIG. 15.

This display portion 1512 generally operates to provide a user interface for a user, and in several implementations, the display is realized by a touchscreen display. In general, the nonvolatile memory 720 is non-transitory memory that functions to store (e.g., persistently store) data and processor-executable code (including executable code that is associated with effectuating the methods described herein). In some embodiments for example, the nonvolatile memory 1520 includes bootloader code, operating system code, file system code, and non-transitory processor-executable code to facilitate the execution of the methods described herein (e.g., the methods described with reference to of FIGS. 11, 13, and 14).

In many implementations, the nonvolatile memory 1520 is realized by flash memory (e.g., NAND or ONENAND memory), but it is contemplated that other memory types may also be utilized. Although it may be possible to execute the code from the nonvolatile memory 1520, the executable code in the nonvolatile memory is typically loaded into RAM 1524 and executed by one or more of the N processing components in the processing portion 1526.

The N processing components in connection with RAM 1524 generally operate to execute the instructions stored in nonvolatile memory 1520 to enable synchronization among equipment coupled to a plasma processing system. For example, non-transitory, processor-executable code to effectuate methods of synchronously pulsing and changing voltages of the source generators and bias supplies may be persistently stored in nonvolatile memory 1520 and executed by the N processing components in connection with RAM 1524. As one of ordinarily skill in the art will appreciate, the processing portion 726 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 1526 may be configured to effectuate one or more aspects of the methodologies described herein (e.g., methods of synchronously operating equipment of a plasma processing equipment). For example, non-transitory processor-readable instructions may be stored in the nonvolatile memory 1520 or in RAM 1524 and when executed on the processing portion 1526, cause the processing portion 1526 to perform methods of synchronously operating modulating supplies and other equipment. Alternatively, non-transitory FPGA-configuration-instructions may be persistently stored in nonvolatile memory 1520 and accessed by the processing portion 1526 (e.g., during boot up) to configure the hardware-configurable portions of the processing portion 1526 to effectuate the functions disclosed herein (including the functions of the synchronization controller 1016.

The input component 1530 operates to receive signals (e.g., the synchronization signals or datasets with waveform characterization data) that are indicative of one or more aspects of the synchronized control between equipment of a plasma processing system. The signals received at the input component may include, for example, the power control and data signals, or control signals from a user interface. The output component generally operates to provide one or more analog or digital signals to effectuate an operational aspect of the synchronization between the equipment. For example, the output portion 1532 may out the synchronization signal and/or waveform datasets.

The depicted transceiver component 1528 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A control system for processing equipment comprising:
a waveform-characterization module configured to generate a waveform dataset for a periodic waveform of a power supply, the waveform dataset characterizes the periodic waveform during a repetition period, T, of the periodic waveform; and
a waveform-communication module configured to provide the waveform dataset as an output to enable the power supply to be synchronized with another piece of equipment.

2. The control system of claim 1, including a synchronization module configured to send a synchronization pulse with a synchronization-pulse-repetition-period that is an integer multiple of T to the other piece of equipment.

3. The control system of claim 2 wherein the waveform-characterization module is configured to generate a plurality of waveform datasets, each of the plurality of waveform datasets characterizes a corresponding one of a plurality of output waveforms, and each of the output waveforms is output from a corresponding one of a plurality of pieces of other equipment;
wherein a waveform-repetition module is configured to determine a fundamental-repetition period, Tf, that is a shortest length of time for which all of the plurality of output waveforms are periodic with period Tf;
wherein a waveform communication module is configured to communicate each of the waveform datasets for each of the plurality of pieces of equipment to one or more of other of pieces of equipment; and
wherein the synchronization module is configured to send a synchronization pulse with a synchronization pulse repetition period that is an integer multiple of Tf to one or more of the plurality of pieces of equipment.

4. The control system of claim 3, wherein the synchronization module is configured to send synchronization ticks between the synchronization pulses if an oscillator of one of the pieces of equipment connected to a plasma system is not accurate enough to maintain time with sufficient accuracy within the fundamental-repetition period, Tf.

5. The control system of claim 4 wherein the synchronization ticks are distinguished from the synchronization pulses by using a pulse with of a different duration from that of the synchronization pulse for the synchronization tick.

6. The control system of claim 1, wherein the waveform-characterization module is configured to generate the waveform dataset as a collection of time-output-value pairs to represent the periodic waveform of the power supply during the repetition period, T.

7. The control system of claim 6, wherein each of the time-output-value pairs includes a time value and at least one of a voltage value, current value, or power value to represent the periodic waveform of the power supply during the repetition period, T.

8. A processing system comprising:
at least one modulating supply configured to modulate, with a repetition period, T, plasma properties of a plasma in a plasma processing chamber;
a plurality of other pieces of plasma processing equipment configured to couple to the plasma processing chamber;
means for producing and sending a waveform dataset to at least one of the plurality of other pieces of equipment, the waveform dataset containing at least one of information about modulation of the plasma or information about a desired waveform of a piece of equipment connected to the plasma processing chamber; and
means for sending a synchronization signal with a synchronization signal repetition period that is an integer multiple of T to the at least one of the plurality of other pieces of equipment connected to the plasma processing chamber.

9. The processing system of claim 8, wherein T is a shortest length of time for which waveforms of all pieces of equipment that modulate the plasma properties of the plasma processing chamber is periodic with period T.

10. The processing system of claim 8, wherein the at least one modulating supply is configured to modulate the plasma properties by modulating electromagnetic fields impacting the plasma.

11. The processing system of claim 8, wherein the at least one modulating supply is a remote plasma source.

12. The processing system of claim 8, wherein the at least one modulating supply is configured to modulate the plasma properties by modulating properties of gases in the plasma processing chamber.

13. The processing system of claim 8, wherein the at least one modulating supply is configured to alternate a surface potential of a workpiece in the plasma between two or more distinct levels.

14. The processing system of claim 8 in which information about the modulation of the plasma includes characteristics of an output waveform generated by the at least one modulating supply.

15. A power supply comprising:
a waveform-characterization module configured to generate a waveform dataset for an output waveform of the power supply, the waveform dataset characterizes the output waveform during a repetition period, T, of the output waveform;
a waveform-communication module configured to communicate the waveform dataset to another piece of equipment; and
a synchronization module configured to send a synchronization pulse with a synchronization-pulse-repetition-period that is an integer multiple of T to another piece of equipment.

16. The power supply of claim 15, wherein the waveform-characterization module is configured to generate the waveform dataset as a collection of time-output-value pairs to represent the output waveform of the power supply during the repetition period, T.

17. The power supply of claim 16, wherein each of the time-output-value pairs includes a time value and at least one of a voltage value, current value, or power value to represent the output waveform of the power supply during the repetition period, T.

18. The power supply of claim 15 including circuitry configured to provide, within the repetition period, T, the output waveform with a first portion with a voltage that increases to a first voltage level, a second portion at the first voltage level, a third portion with a negative voltage swing along a first negative voltage ramp to a second voltage level, and a fourth portion that includes a second negative voltage ramp from the second voltage level.

19. The power supply of claim 18, wherein the waveform dataset includes a collection of time-output-value pairs, wherein each time-output-value pair corresponds to each of the portions of the output waveform during the repetition period, T.

* * * * *